(12) United States Patent
Knight

(10) Patent No.: US 7,226,722 B1
(45) Date of Patent: Jun. 5, 2007

(54) IMAGING MEMBERS WITH IR-SENSITIVE POLYMER IMAGEABLE LAYER

(75) Inventor: Elizabeth Knight, Lafayette, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/333,703

(22) Filed: Jan. 17, 2006

(51) Int. Cl.
*G03F 7/038* (2006.01)
*G03F 7/14* (2006.01)
*G03F 7/30* (2006.01)

(52) U.S. Cl. .............................. 430/278.1; 430/271.1; 430/302; 430/330; 430/944; 430/964

(58) Field of Classification Search ............ 430/270.1, 430/271.1, 278.1, 302, 330, 944, 964
See application file for complete search history.

(56) References Cited

U.S. PATENT DOCUMENTS

| 5,908,705 | A | | 6/1999 | Nguyen et al. |
| 6,143,470 | A | | 11/2000 | Nguyen et al. |
| 7,008,758 | B2 | * | 3/2006 | Park et al. ................ 430/325 |
| 2004/0265755 | A1 | * | 12/2004 | Park et al. ................ 430/322 |
| 2005/0131139 | A1 | * | 6/2005 | Kaner et al. ............... 524/800 |
| 2006/0237694 | A1 | * | 10/2006 | Kaner et al. ............... 252/500 |

OTHER PUBLICATIONS

J. Huang & R.B. Kaner, *Flash welding of conducting polymer nanofibres*, "Nature Materials", vol. 3, Nov. 2004, pp. 783-786.

* cited by examiner

*Primary Examiner*—Richard L. Schilling
(74) *Attorney, Agent, or Firm*—J. Lanny Tucker

(57) ABSTRACT

A negative-working, imageable element comprises a substrate and an IR-sensitive imageable layer comprising a dispersion of nanofibers of a preformed IR-sensitive polymer. The nanofibers can be composed of polyaniline, polypyrrole, or polythiophene. The IR-sensitive imageable layer containing the nanofibers can be imaged using infrared radiation and used for printing without further processing. Thus, both imaging and printing can be carried out on-press.

20 Claims, No Drawings

IMAGING MEMBERS WITH IR-SENSITIVE POLYMER IMAGEABLE LAYER

FIELD OF THE INVENTION

This invention relates to negative-working imageable elements that are sensitive to infrared radiation. The elements contain an IR-sensitive polymer in the form of nanofibers as the imaging chemistry. The invention also relates to methods of imaging the noted imageable elements.

BACKGROUND OF THE INVENTION

Lithography and offset printing methods have long been combined in a compatible arrangement of great convenience for the printing industry to provide economical, high speed, and high quality image duplication in various run sizes. Known lithographic methods have generally required the imaging of a photosensitive film followed by exposing a lithographic printing plate precursor using the film as a masking element, and development of the resulting printing plate image with various aqueous developers and rinsing solutions.

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Alternatively, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer usually includes one or more radiation-sensitive components that can be dispersed or dissolved in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

While this process has been used for many years to provide high-quality images, the process is relatively inefficient and laborious. More recently, advances in the industry have provided image formation by digital computer aided design of graphical material or text. This manner of "computer-to-plate" (CTP) imaging is extremely advantageous because images can be easily edited or converted prior to imaging. This imaging method is particularly useful for the lower run printing jobs.

Thus, direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. Patent Application Publication 2004/0067432 A1 (Kitson et al.).

Other digital imaging methods have been achieved using lasers as described for example in U.S. Pat. No. 5,339,737 (Lewis et al.), U.S. Pat. No. 5,353,705 (Lewis et al.), and U.S. Pat. No. 5,351,617 (Williams et al.) wherein the laser output ablates one or more layers of the imageable element, resulting in an imagewise pattern of features on the element. Producing images by ablation has its disadvantages including unwanted debris and vapors from the imaging process and images that may lack desired sharpness because imaged areas are incompletely removed. Ablated matter requires appropriate removal from the imaging layer and disposal.

Digital imaging can also be achieved by laser exposure of a heat-sensitive layer in an imageable element whereby imaged areas are selectively changed in affinity for aqueous solutions or oleophilic inks, depending upon the composition of the heat-sensitive layer. Examples of this type of imaging are provided, for example, in U.S. Pat. No. 5,985,514 (Zheng et al.), U.S. Pat. No. 6,159,657 (Fleming et al.), U.S. Pat. No. 6,190,830 (Leon et al.), U.S. Pat. No. 6,190,831 (Leon et al.), U.S. Pat. No. 6,399,268 (Fleming et al.), U.S. Pat. No. 6,410,202 (Fleming et al.), U.S. Pat. No. 6,447,978 (Leon et al.), and U.S. Pat. No. 6,451,500 (Leon et al.).

Positive-working lithographic printing plate precursors containing an IR-sensitive polythiophene, polypyrrole, or polyaniline in a single imaging layer are described in U.S. Pat. No. 5,908,705 (Nguyen et al.). These imaging layers are designed to provide a positive-working image by removal of the imaged areas of the IR-sensitive polymer by ablation. The IR-sensitive polymers are formed either by solution polymerization prior to coating or by in-situ polymerization on the substrate after the appropriate monomers are deposited on the substrate by vapor deposition or coating and contacted with a suitable catalyst. If solution polymerization is used, it is preferred to crosslink the IR-sensitive polymer with a polymeric binder. U.S. Pat. No. 5,908,705 specifically discourages the use of solid "preformed" polypyrroles or other IR-sensitive polymers because it results in non-uniform distribution of the polymer throughout the coating, and hence, non-uniform ablation.

Huang and Kaner in *Nature Materials*, Vol. 31 (November), 2004, Nature Publishing Group, describe nanofibers of polyaniline that are welded into a composite using flash irradiation. Various speculative uses of the nanofibers are proposed but none is demonstrated.

PROBLEM TO BE SOLVED

The imaging methods described above and in hundreds of other publications that use thermal imaging means such as sources of infrared radiation generally require the presence of one or more infrared absorbing compounds such as infrared radiation-sensitive dyes (IR dyes) and/or pigments such as carbon blacks. These compounds are relatively expensive.

As noted above, many IR-imaging methods require ablation of the imaging layer with the problems accompanying that technique.

In addition, the conventional methods of imaging both negative-working and positive-working lithographic printing plate precursors generally require one or more processing steps using aqueous developers or other processing chemicals prior to use. Despite the advances in digital imaging to improve lithographic imaging and printing, the necessary processing steps used after conventional IR-imaging methods require handling and disposal of processing solutions.

There is a desire in the printing industry for digital imaging and printing methods whereby conventional "wet" processing and the use of expensive IR-sensitive dyes or pigments can be avoided or reduced in coverage, if desired. It would also be desired to have negative-working imageable elements that are effectively imaged without ablation, are insensitive to ambient light, and exhibit desired shelf life and imaging properties.

SUMMARY OF THE INVENTION

The present invention provides a negative-working, imageable element comprising a substrate and having disposed thereon, an IR-sensitive imageable layer comprising a dispersion of nanofibers of a preformed IR-sensitive polymer.

In addition, this invention provides a method of forming an imaged element comprising:

A) imagewise exposing the imageable element described above to provide an imaged element with both imaged and non-imaged areas, and B) processing the imaged element on-press to remove the non-imaged areas.

Other embodiments of this invention include the imaged elements obtained from the noted method.

The present invention provides a method for imaging and printing with a negative-working imageable element without conventional processing steps. The imageable element can be imaged and processed on-press where it is immediately available for printing. The imaged and non-imaged areas are formed in the imageable layer containing IR-sensitive polymers that are present as nanofibers. These nanofibers are believed to crosslink, melt, fuse, or coalesce in the imaged areas. Ablation does not occur to any appreciable extent (less than 10% of the dry weight). The use of IR-sensitive dyes and/or pigments can be avoided, if desired, and non-IR-sensitive polymer binders are also optional in the IR-sensitive imageable layer.

DETAILED DESCRIPTION OF THE INVENTION

Definitions

Unless the context indicates otherwise, when used herein, the terms "IR-sensitive imageable element", "imageable element", and "printing plate precursor" are meant to be references to embodiments of the present invention.

In addition, unless the context indicates otherwise, the various components described herein such as the "preformed IR-sensitive polymer", "colorant", "coating solvent", "radiation absorbing compound", "non-IR-sensitive polymer binder", and similar terms also refer to mixtures of such components. Thus, the use of the article "a" or "an" is not necessarily meant to refer to only a single component.

Unless otherwise indicated, percentages refer to percentages by dry weight.

The term "nanofibers" as used to define the IR-sensitive polymers refer to elongated particles or fibers of three dimensions that have one elongated dimension that is greater than the other two dimensions (that is, the cross-sectional dimensions). Of the two cross-sectional dimensions, the number average largest cross-sectional dimension across the elongated dimension is generally from about 1 to about 200 nm and preferably from about 20 to about 150 nm. The elongated dimension can be up to 10 µm. The nanofibers may be flexible and can have a variety of conformations. They can be straight, curved, coiled, or branched. Generally, in a dry coated polymer layer, they are entangled together.

The IR-sensitive polymers are "preformed" meaning that they are prepared as polymers from suitable polymerizable monomers or reactants prior to coating and imaging. They are not formed in-situ from monomers during imaging as described in U.S. Pat. No. 5,908,705 (noted above).

By "IR-sensitive" it is meant that the IR-sensitive polymer is sensitive to electromagnetic radiation that has a $\lambda_{max}$ within the range of from about 700 to about 1200 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Uses

The imageable elements can be used in a number of ways. The preferred use is as precursors to lithographic printing plates as described in more detail below. However, this is not meant to be the only use of the elements of the present invention. For example, the imageable elements can also be used as thermal patterning systems and to form masking elements and printed circuit boards.

Imageable Element

In simplest terms, the imageable element of this invention comprises a single IR-sensitive imageable layer disposed on a suitable substrate. However, it is possible for the element to have two IR-sensitive imageable layers disposed together on the substrate, whereby the two layers have different IR-sensitive materials as long as one of the IR-sensitive imageable layers includes the nanofibers of an IR-sensitive polymer as described herein. It is also possible, as described below, for the imageable element to include one or more non-imaging layers underneath, overlying, between, or in multiple locations.

The substrate can be an untreated or uncoated support but it can also be treated or coated in various ways as described below. The substrate generally has a hydrophilic surface or at least a surface that is more hydrophilic than the IR-sensitive imageable layer. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing with phosphoric acid or sulfuric acid. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the grained and sulfuric acid anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the IR-sensitive layer compositions applied thereon (for example, by spray coating), and thus be an integral part of the printing press. The use of such imaged cylinders is described for example in U.S. Pat. No. 5,713,287 (Gelbart).

The IR-sensitive imageable layer in the imageable element comprises one or more preformed IR-sensitive polymers. These polymers are usually formulated for coating as a dispersion of nanofibers as defined above. While any IR-sensitive polymer can be used in the practice of this invention, as long as it is used in the form of nanofibers, generally the IR-sensitive polymer is a preformed polypyrrole, polythiophene, or polyaniline that are prepared by polymerization of the appropriate pyrrole, thiophene, or aniline monomers or their substituted derivatives using suitable catalysts and reaction conditions that are known in the art. Conventional reactants and reaction ingredients are available from various commercial sources. The nanofibers of preformed polyanilines are preferred in this invention.

Substituted derivatives of the polymerizable compounds include the alkyl, aryl, alkene, hydroxyalkyl, haloalkyl, trialkoxy silyl, carboxylate, and sulfonate derivatives of thiophene, aniline, and pyrrole.

For example, polypyrroles can be formed by polymerization of pyrrole or derivative thereof including but not limited to, N-methylpyrrole, N-ethyl pyrrole, (1-trimethoxy silyl propyl)pyrrole, and 3-n-octyl pyrrole.

Polyanilines can be prepared by the polymerization of, for example, aniline, N-methyl aniline, N-n-butyl aniline, 2-methyl aniline, or 2-aminobenzyl alcohol using n-dodecylbenzyl sulfonic acid and benzoyl peroxide, for example, as counter ion and oxidizing agent, respectively.

Polythiothenes can be prepared by the polymerization of, for example, thiophene, 2-hexyl thiophene, or 3-n-octyl thiophene using ferric chloride, for example, as an oxidative agent.

To provide nanofibers of these polymers, one can manufacture the polymers from the appropriate monomers using an oxidizing compound. Additional components include the appropriate solvents, surfactants, and/or acids. Alternatively, instead of an oxidizing compound, electrochemical oxidizing methods may be used. A variety of methods may be used to obtain the nanofibers structure of the polymer during preparation. Templates such as zeolites, polycarbonates, alumina, membranes, or micelles may be used. Physical methods such as electrospinning and mechanical stretching may be used. Most preferred are methods that take advantage of solution synthesis that form the nanofibers during the polymerization process and avoid extensive purification, such as by the addition of surfactants or by interfacial polymerization. After formation of the polymer nanofibers during the polymerization process, the polyanilines, polythiophenes, or polypyrroles are generally isolated from the reaction mixture and then immediately diluted with water to make a nanofiber dispersion. The size of the nanofibers in the dispersions can be confirmed by scanning electron microscope (SEM) images of a dried sample of the dispersion.

The IR-sensitive polymer nanofibers are generally present in the IR-sensitive imageable layer at a coverage of from about 0.1 to about 0.6 $g/m^2$ and preferably from about 0.2 to about 0.5 $g/m^2$. Higher amounts of the nanofibers are undesirable because when the layer is too thick, imaging radiation cannot penetrate the lower regions of the layer and adhesion to the substrate may be poor in those regions, resulting in low run length. Lower amounts are undesirable because the resulting printed image would have insufficient ink density. The amount of IR-sensitive polymer in the IR-sensitive imageable layer generally comprises from about 25% to 100% based on total dry IR-sensitive imageable layer weight.

If desired, the preformed IR-sensitive polymer nanofibers are dispersed in a non-IR-sensitive binder polymer before coating as a film. These binder polymers are generally water-soluble or -dispersible. Preferably, they are water-soluble and include but are not limited to, poly(vinyl alcohol)s, poly(vinyl pyrrolidone)s, poly(ethyleneimine), poly(ethyloxazoline), poly(acrylamide), poly(vinyl imidzole), poly(acrylic acid) and salts thereof, poly(methacrylic acid) and salts thereof, gelatin and derivatives thereof, hydroxypropylcellulose, hydroxyethylcellulose, hydroxypropylmethylcellulose, carboxymethylcellulose, poly(vinyl pyrrolidone)/poly(vinyl acetate) copolymers, and poly(vinyl pyrrolidone)/vinyl caprolactam copolymers. Various latex polymers may also be useful as "binders". Also useful are the copolymers described in U.S. Patent Application Publication 2005-0003285 (Hayashi et al.) that contain pendant poly(alkylene oxide) groups.

When present, the binder polymers are generally present in the IR-sensitive imageable layer in an amount of from about 5% to about 60% based on total dry layer weight.

While the IR-sensitive polymer described above is preferably the only IR-sensitive material in the imaging layer, the IR-sensitive imageable layer can also include one or more radiation absorbing compounds (such as infrared radiation absorbing compounds) that absorb radiation at from about 600 to about 1200 and preferably at from about 700 to about 1200 nm, with minimal absorption at from about 300 to about 600 nm. This compound (sometimes known as a "photothermal conversion material") absorbs radiation and converts it into heat and may be either a dye or pigment. Examples of useful pigments are ProJet 900, ProJet 860 and ProJet 830 (all available from the Zeneca Corporation). Although a radiation absorbing compound is not necessary for imaging with a hot body, imageable elements containing a radiation absorbing compounds may also be imaged with a hot body, such as a thermal head or an array of thermal heads.

Useful IR absorbing compounds also include iron oxides and carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.).

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

The radiation absorbing compound can be present in an amount of generally at up to 15%, based on the total dry IR-sensitive imageable layer weight.

The IR-sensitive imageable layer can also include various optional components such as surfactants, dispersing aids, humectants, biocides, viscosity builders, drying agents, defoamers, preservatives, and antioxidants.

The IR-sensitive imageable layer generally has a dry coating coverage of from about 0.1 to about 1.2 $g/m^2$ and a dry coating thickness of from about 0.2 to about 1.5 µm.

The imageable element can further comprise a non-radiation sensitive overcoat disposed over the IR-sensitive imageable layer. This overcoat can be composed of various water-soluble or -dispersible polymer binders such as poly(vinyl pyrrolidone)s, poly(ethyloxazoline)s, and poly(vinyl pyrrolidone)/vinyl acetate copolymers and may also include surfactants, and other addenda known to be included in such overcoat compositions. Care must be taken to design the overcoat so that it does not adversely affect imaging in the IR-sensitive imageable layer and can be removed in non-imaged areas.

Preparation of the Imageable Element

The IR-sensitive imageable element can be prepared by applying an IR-sensitive layer formulation containing the nanofibers over the surface of the substrate (and any other hydrophilic layers provided thereon) using conventional coating or lamination methods.

The nanofibers dispersion and any other desired ingredients are dispersed in suitable coating solvents (such as water, alcohols, ketones, and other water-miscible solvents) and the resulting formulation is applied to the substrate using any suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

When solvents in which the nanofibers are soluble (such as N,N-dimethylformamide) are used as the predominant coating solvents, the resulting coated film appears to be non-imageable (see Comparative Example 3 below). It appears that imaging according to this invention requires the IR-sensitive polymer to be present as dispersed nanofibers and not as a film-forming solution polymer.

Intermediate drying steps may be used between applications of the various layer formulations to remove solvent(s) before coating other formulations. Drying steps may also help in preventing the mixing of the various layers.

Representative methods for preparing the IR-sensitive imageable elements are shown in the Examples below.

The IR-sensitive imageable elements have any useful form including, but not limited to, printing plate precursors, printing cylinders, printing sleeves and printing tapes (including flexible printing webs). Preferably, the IR-sensitive imageable members are printing plate precursors to provide lithographic printing plates. Such printing plate precursors can be of any useful size and shape (for example, square or rectangular) having the requisite layer(s) disposed on a suitable substrate. Printing cylinders and sleeves are known as rotary printing members having the substrate in a cylindrical form. Hollow or solid metal cores can be used as substrates for printing sleeves.

Imaging Methods

During use, the IR-sensitive imageable element is exposed to a suitable source of imaging infrared radiation using a laser at a wavelength of from about 600 to about 1200 nm and preferably from about 700 to about 1200 nm. The lasers used for imaging are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus is available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Gerber Crescent 42T Platesetter that operates at a wavelength of 1064 nm (available from Gerber Scientific, Chicago, Ill.) and the Screen PlateRite 4300 series or 8600 series platesetters (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and more particularly from about 75 to about 400 $mJ/cm^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing" as described for example in U.S. Pat. No. 5,488,025 (Martin et al.) and as used in thermal fax machines and sublimation printers. Thermal print heads are commercially available (for example, as Fujitsu Thermal Head FTP-040 MCS001 and TDK Thermal Head F415 HH7-1089).

In any case, direct digital imaging is generally used for imaging. The image signals are stored as a bitmap data file on a computer. Such files may be generated by a raster image processor (RIP) or other suitable means. The bitmaps are constructed to define the hue of the color as well as screen frequencies and angles.

Imaging of the IR-sensitive imageable element produces an imaged element that comprises a latent image of imaged (exposed) and non-imaged (non-exposed) regions. Developing the imaged element with a suitable solution (such as a lithographic printing ink, with or without a fountain solution) removes the non-exposed regions of the IR-sensitive imageable layer, exposing the hydrophilic substrate below it. Thus, the IR-sensitive imageable element is "negative-working" and provides a negative printing image.

The imaged element can be used for printing by applying a suitable lithographic ink and fountain solution to its printing surface. The ink is taken up by the imaged (exposed or non-removed) regions of the IR-sensitive imaging layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged element to the receiving material. The imaged elements can be cleaned between impressions, if desired, using conventional cleaning means and chemicals.

The following examples are provided to illustrate the practice of the invention but are by no means intended to limit the invention in any manner.

EXAMPLES

In the Examples, the following materials and methods were used:

A polyaniline nanofiber dispersion was prepared as follows: A solution of 29.85 g of aniline in 200 ml of toluene was carefully poured on top of a solution of 18.24 g of ammonium persulfate in 1 liter of hydrochloric acid (10% acid by volume) so as to form two layers. The polyaniline nanofibers began forming at the liquid—liquid interface within several minutes. After letting the layers sit overnight, the toluene layer was removed, leaving the acid layer containing the dark green polyaniline nanofibers as a dispersion. The acid/nanofiber dispersion was dialyzed for approximately 36 hours in dialysis tubing with a molecular weight cutoff (MWCO) of 3500 to remove excess hydrochloric acid. The dispersion was filtered to collect the polyaniline nanofibers, which were then immediately diluted with water to form an aqueous dispersion of 6.4% solids content. A portion of the dispersion was coated on substrate as described in Example 1 and dried. Examination of this coating using a scanning electron microscope (SEM) confirmed the nanofiber structure of the polymer in the coated dispersion.

The substrate used for the imageable elements was an aluminum sheet that had been treated by electrochemical graining and then anodized with sulfuric acid. It had then been post-treated with poly(vinyl phosphonic acid) to form a hydrophilic surface.

The "graft copolymer" was a dispersion of poly[styrene-co-poly(ethylene glycol)] that was prepared using the teaching provided in U.S. Pat. No. 6,899,994 (Huang et al.).

The Thiosulfate Copolymer was a poly(vinyl benzyl thiosulfate sodium salt-co-methyl methacrylate) polymer that was prepared as described in U.S. Pat. No. 5,985,514 (Zheng et al.).

Example 1

An imaging formulation was prepared from 5.46 g of the polyaniline dispersion described above, 4.15 g of water, and 0.39 g of n-butanol. This formulation was coated on the aluminum substrate using a K303 bar coater (R.K. Print-Coat Instruments Ltd, United Kingdom) and a #2 wire wound bar. After drying, the polyaniline coating weight was 0.35 $g/m^2$. Samples of the resulting negative-working IR-sensitive lithographic printing plate precursor were imaged on a Creo Trendsetter 3244 imagesetter (Creo Inc., Canada) at various exposures 300, 400, and 500 $mJ/cm^2$. The imaged lithographic printing plates were mounted on an A.B. Dick 9870 duplicator press without further processing (for example, without conventional developer processing). The non-imaged regions of the imageable layer were removed in the presence of Rubber Base Black 10850 ink (vanSon Royal Dutch Printing, Holland) and Litho Etch 142W plus PAR fountain solution (Varn International, Addison Ill.) on the press. The printed sheets showed full ink density by 50 impressions. All exposed printing plates printed to 200 impressions at which time the printing press was stopped.

Example 2

An imaging formulation was prepared from 1.37 g of the polyaniline dispersion noted above, 0.35 g of the 25% solids graft copolymer dispersion (to provide a binder), 3.09 g of water, and 0.19 g of n-butanol. The formulation was coated to provide a negative-working imageable element that was imaged, and without processing using conventional alkaline developers, mounted on a printing press, and used for printing as described above in Example 1. The printed sheets showed full ink density by 10 impressions. All exposed printing plates printed to 200 impressions at which time the press was stopped.

Comparative Example 1

A coating solution was prepared from 5.70 g of the polyaniline dispersion, 3.92 g of water, and 0.38 g of n-butanol. This solution was coated on the aluminum substrate using a K303 bar coater (R.K. Print-Coat Instruments Ltd, United Kingdom) and a #3 wire wound bar. After drying, the polyaniline coating weight was 0.77 g/m$^2$. The resulting negative-working lithographic printing plate precursor was imaged on a Creo Trendsetter 3244 imagesetter (Creo Inc., Canada) at 300 mJ/cm$^2$. However, the imaged areas on the printing plate were easily removed by rubbing under water. Thus, the printing plate did not have a useful imaging layer. The imaged layer was too easily removed and would not hold up under printing typical conditions.

Examples 3–7

Imaging formulations were prepared from 2.46 g of the polyaniline dispersion, 0.17 g of a 10% non-IR-sensitive binder solution in water, 2.18 g of water, and 0.19 g of n-butanol. The formulations were coated to provide negative-working imageable elements, imaged, and without conventional processing, mounted on press, and used for printing as described in Example 1. All exposed printing plates printed to 200 impressions at which time the press was stopped. The printing results are described below in TABLE I. It is apparent that various non-IR sensitive binders can be used in the imaging layer but some binders enabled better performance than others. Performance may be improved with adjustments in the amount of non-IR-sensitive binders and the type of preformed IR-sensitive polymer.

TABLE I

| Example | Binder | Results |
|---|---|---|
| 3 | Poly(vinyl alcohol) | Reached full ink density by 50 impressions; 300 and 400 mJ/cm$^2$ images showed some wear by 200 impressions |
| 4 | Poly(vinyl imidazole) | Reached full ink density by 25 impressions; 300 mJ/cm$^2$ image showed slight wear by 200 impressions |
| 5 | Poly(ethyl-oxazoline) | Never reached full ink density, but all exposures printed to 200 impressions |
| 6 | Poly(vinyl pyrrolidone) | Never reached full ink density, but all exposures printed to 200 impressions |
| 7 | Thiosulfate copolymer | Reached full ink density by 50 impressions; 300 mJ/cm$^2$ image showed slight wear by 200 impressions |

Comparative Example 2

Polyaniline (emeraldine salt) having a molecular weight of about 15,000 was obtained from Aldrich Chemical Company, and without further processing, 0.63 g of the powered polymer were mixed with 0.69 g of a polyvinyl imidazole solution (10% solids in water), 17.9 g of water, and 0.77 g of n-butanol. The resulting dispersion was coated on an aluminum substrate using a #2 wire wound bar to provide a negative-working imageable element.

A second negative-working imageable element was made by coating the same dispersion onto the aluminum substrate using a #3 wire wound bar.

After drying, the coating weights of the two imageable elements were 0.30 and 0.65 g/m$^2$, respectively. SEM images of the 0.65 g/m$^2$ second plate surface showed particle agglomerations on the order of 1–20 μm in diameter. The two imageable elements were individually imaged and mounted on press, and printing was attempted as described in Example 1. The resulting first printing plate having the 0.30 g/m$^2$ coating weight did not print any images. The resulting second printing plate having the 0.65 g/m$^2$ coating weight printed only a very faint image at a 500 mJ/cm$^2$ exposure, only very faint traces at the 400 mJ/cm$^2$ exposure, and no image at the 300 mJ/cm$^2$ exposure. It appears that the size of the polyaniline particles in the imaging layer was too large to provide printing plates.

Comparative Example 3

N,N-dimethylformamide (DMF) was added to the polyaniline dispersion described above in Example 1 and the resulting solution was coated on the aluminum substrate as described in that example. However, a scanning electron microscope (SEM) image showed that the nanofibers dissolved in the DMF and the resulting coating was more of a uniform film rather than a dispersion of nanofibers. The resulting element, without imaging, was mounted on press. The non-imaged coating was fully ink-receptive by 20 impressions and continued to print up to 200 impression when the press was stopped. Thus, a uniform polyaniline film cannot be used in accordance with the present invention as it is not on-press developable in the non-imaged areas.

The invention has been described in detail with particular reference to certain preferred embodiments thereof, but it will be understood that variations and modifications can be effected within the spirit and scope of the invention.

The invention claimed is:

1. A negative-working, imageable element comprising a substrate and having disposed thereon, an IR-sensitive imageable layer comprising a dispersion of nanofibers of a preformed IR-sensitive polymer,
    wherein said substrate comprises a metal or polymeric film support.

2. The element of claim 1 wherein said IR-sensitive polymer is a preformed polypyrrole, polythiophene, or polyaniline.

3. The element of claim 2 wherein said IR-sensitive polymer is a preformed polyaniline.

4. The element of claim 1 wherein said preformed IR-sensitive polymer nanofibers are dispersed in a non-IR-sensitive binder polymer.

5. The element of claim 1 wherein said preformed IR-sensitive polymer nanofibers have a number average largest cross-sectional dimension of from about 1 to about 200 nm.

6. The element of claim 5 wherein said preformed IR-sensitive polymer nanofibers are preformed polyaniline nanofibers having a number average largest cross-sectional dimension of from about 20 to about 150 nm.

7. The element of claim 1 wherein said substrate comprises an aluminum or polyester support.

8. The element of claim 1 further comprising a non-radiation sensitive overcoat disposed over said IR-sensitive imageable layer.

9. The element of claim 1 wherein said IR-sensitive polymer nanofibers are present in said IR-sensitive imageable layer at a coverage of from about 0.1 to about 0.6 g/m².

10. The element of claim 1 wherein said IR-sensitive imageable layer has a dry thickness of from about 0.1 to about 1.5 µm.

11. The element of claim 1 wherein said IR-sensitive imageable layer further comprises a radiation absorption compound.

12. The element of claim 11 wherein said radiation absorption compound is a carbon black or an IR dye.

13. A method of forming an imaged element comprising:
A) imagewise exposing an imageable element comprising a substrate and having disposed thereon, an IR-sensitive imageable layer comprising a dispersion of nanofibers of a preformed IR-sensitive polymer, to provide an imaged element with both imaged areas and non-imaged areas, and
B) processing said imaged element on-press to remove said non-imaged areas.

14. The method of claim 13 wherein both of steps A and B are carried out on-press.

15. The method of claim 13 wherein imagewise exposing step A is carried out using a laser and radiation having a maximum wavelength of from about 700 to about 1200 nm.

16. The method of claim 13 wherein said preformed IR-sensitive polymer nanofibers are preformed polyaniline nanofibers that have a number average largest cross-sectional dimension of from about 1 to about 200 nm.

17. The method of claim 13 wherein said IR-sensitive imageable layer further comprises a radiation absorption compound.

18. The method of claim 13 wherein imaging step A is carried out without substantial ablation of said IR-sensitive imaging layer.

19. The method of claim 13 wherein said preformed IR-sensitive polymer nanofibers are mixed with a non-IR-sensitive binder polymer.

20. An imaged element obtained from the method of claim 13.

* * * * *